United States Patent
Lee

(10) Patent No.: US 7,705,660 B2
(45) Date of Patent: Apr. 27, 2010

(54) SUBSTRATE BIAS VOLTAGE GENERATOR AND METHOD OF GENERATING SUBSTRATE BIAS VOLTAGE

(75) Inventor: Jong-Won Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 373 days.

(21) Appl. No.: 11/602,347

(22) Filed: Nov. 21, 2006

(65) Prior Publication Data

US 2007/0153611 A1   Jul. 5, 2007

(30) Foreign Application Priority Data

Dec. 29, 2005   (KR) .................. 10-2005-0133716

(51) Int. Cl.
*H03K 3/01*   (2006.01)
(52) U.S. Cl. .................. 327/534; 365/189.09
(58) Field of Classification Search .......... 327/534, 327/535
See application file for complete search history.

(56) References Cited

U.S. PATENT DOCUMENTS

| | | | | |
|---|---|---|---|---|
| 4,961,167 | A | * | 10/1990 | Kumanoya et al. ..... 365/189.09 |
| 5,315,557 | A | * | 5/1994 | Kim et al. .................. 365/222 |
| 5,602,506 | A | * | 2/1997 | Kim et al. .................. 327/535 |
| 5,744,997 | A | * | 4/1998 | Kang et al. ................. 327/537 |
| 5,886,932 | A | | 3/1999 | Choi |
| 5,920,226 | A | * | 7/1999 | Mimura .................... 327/537 |
| 5,956,281 | A | | 9/1999 | Nakai et al. |
| 6,421,281 | B2 | | 7/2002 | Suzuki |
| 6,781,908 | B1 | | 8/2004 | Pelley et al. |
| 6,882,215 | B1 | * | 4/2005 | Lee .......................... 327/536 |

FOREIGN PATENT DOCUMENTS

| | | |
|---|---|---|
| JP | 10021685 | 1/1998 |
| JP | 11016351 | 1/1999 |
| KR | 100231602 | 8/1999 |

* cited by examiner

*Primary Examiner*—Lincoln Donovan
*Assistant Examiner*—Ryan C Jager
(74) *Attorney, Agent, or Firm*—Venable LLP; Jeffri A. Kaminski

(57) ABSTRACT

A substrate bias voltage detection unit compares a level of a substrate bias voltage with a reference voltage in response to a self-refresh signal, an idle signal, and a refresh count signal so as to output an oscillating driving signal, enables the oscillating driving signal when the substrate bias voltage is equal to or higher than a first level in a normal mode, disables the oscillating driving signal when the substrate bias voltage is at a second level in a self-refresh mode, and disables the oscillating driving signal when the substrate bias voltage is at a third level in the self-refresh mode. An oscillation unit outputs an oscillating signal according to the oscillating driving signal. A voltage pumping unit controls pumping of the substrate bias voltage according to an output signal of the oscillation unit and then outputs a pumped substrate bias voltage.

27 Claims, 5 Drawing Sheets

SUBSTRATE BIAS VOLTAGE GENERATOR AND METHOD OF GENERATING SUBSTRATE BIAS VOLTAGE

BACKGROUND

1. Technical Field

The present invention relates to a voltage generator, and more particularly, to a substrate bias voltage generator and a method of generating a substrate bias voltage in which voltages having different levels can be supplied in normal and refresh operations in a semiconductor memory apparatus.

2. Related Art

In general, a sense amplifier of a semiconductor memory apparatus senses cell data when a voltage difference $\Delta V$ between an amount of electric charges, which are applied to a bit line according to an amount of electric charges stored in a cell, and an amount of electric charges, which are applied to a bit line bar by charge sharing, becomes sufficiently larger than an offset voltage of the sense amplifier. The voltage difference $\Delta V$ between the bit line and the bit line bar can be expressed by the following equation 1.

$$\Delta V = (VCORE - VBLP)/\{1 + (CB/CC)\} \qquad [\text{Equation 1}]$$

Here, the voltage VCORE is a sense amplifier driving voltage, and the voltage VBLP is a bit line precharge voltage. As can be seen in Equation 1, in general, as a CB (bit line capacitance) decreases and a CC (cell capacitance) increases, the voltage difference $\Delta V$ increases. As a result, a precise sensing operation can be performed.

FIG. 1 is a timing diagram illustrating an operation of a sense amplifier in a conventional semiconductor memory apparatus.

For example, during a precharge operation, both the bit line and the bit line bar are precharged to a precharge voltage VBLP. Assuming that the cell data is at a high level, when a word line WL is activated, electric charges stored in the cell start to charge a bit line BL1 and a bit line bar BLb1 so as to be shared therebetween. Then, after a sensing period of time passes, the voltage of the bit line BL1 increases by $\Delta V1$ with respect to the bit line bar BLb1. Then, by means of a sense amplifier enable signal, the voltage of the bit line BL1 rises to a VCORE level and the voltage of the bit line bar BLb1 is amplified to a ground potential GND level.

On the other hand, assuming that the cell data is at a low level, when the word line WL is activated, the electric charges stored in the cell charge a bit line BL0 and a bit line bar BLb0 so as to be shared therebetween. Then, after the sensing period of time passes, the voltage of the bit line BL0 falls by $\Delta V0$. Then, the voltage of the bit line BL0 is amplified to the ground potential GND level and the voltage of the bit line bar BLb0 is amplified to the VCORE level.

Here, in order to perform a precise sensing operation, the values $\Delta V1$ and $\Delta V0$ should be larger than the offset voltage of the sense amplifier. If the voltage difference between the bit line and the bit line bar is not sufficient, an error occurs in a sensing result of the sense amplifier.

Therefore, the voltage differences need to be made sufficiently large by decreasing the CB value or increasing the CC value in Equation 1. A method of decreasing the CB value includes a method of controlling a voltage, which is applied to the sense amplifier and a substrate in a cell array region, to have a negative value. When this method is used, the CB value is reduced and the threshold voltage of a cell transistor increases. This reduces the electric charges stored in the cell from leaking through a channel, and accordingly, a refresh characteristic can also be improved.

However, as semiconductor memory apparatuses are highly integrated, the semiconductor memory apparatuses are manufactured using a shallow junction technique. When the shallow junction technique is applied, the impurity concentration in source/drain regions and the body increases, and as a result, the leaking between the source/drain regions and the body significantly increases. Such a leaking phenomenon increases as a voltage applied to the body becomes smaller (that is, as a negative voltage becomes larger), which deteriorates the refresh characteristic.

On the other hand, the threshold voltage of the cell transistor increases as an absolute value of a substrate bias voltage applied to the body becomes larger. Accordingly, in order to sufficiently store the cell data again through a refresh operation, a problem occurs in that a gate voltage should be sufficiently high.

In other words, in the case in which the substrate bias voltage is controlled to have a negative value, the data storage capability of a cell is improved; however, if the control is not made such that the gate voltage has a high value in order to perform the refresh operation, the refresh efficiency is lowered.

SUMMARY

Embodiments of the present invention provide a substrate bias voltage generator and a method of generating a substrate bias voltage, which can improve a refresh characteristic and a data storage capability of a cell by differently controlling a substrate bias voltage in a normal operation and a refresh voltage in a refresh operation.

Furthermore, embodiments of the present invention easily raise the substrate bias voltage, even when a capacitance value at a substrate bias voltage stage is large, by increasing the substrate bias voltage in a stepwise manner.

According to a first embodiment of the present invention, a substrate bias voltage generator includes: a substrate bias voltage detection unit that compares a level of a substrate bias voltage with a reference voltage in response to a self-refresh signal, an idle signal, and a refresh count signal so as to output an oscillating driving signal, enables the oscillating driving signal when the substrate bias voltage is equal to or higher than a first level in a normal mode, disables the oscillating driving signal when the substrate bias voltage is at a second level in a self-refresh mode, and disables the oscillating driving signal when the substrate bias voltage is at a third level in the self-refresh mode; an oscillation unit that outputs an oscillating signal according to the oscillating driving signal; and a voltage pumping unit that controls pumping of the substrate bias voltage according to an output signal of the oscillation unit and then outputs the pumping-controlled substrate bias voltage.

According to a second embodiment of the present invention, a substrate bias voltage generator includes: a substrate bias voltage detection unit that compares a level of a substrate bias voltage with a reference voltage in response to a self-refresh signal so as to output an oscillating driving signal, enables the oscillating driving signal when the substrate bias voltage is equal to or higher than a first level in a normal mode, and disables the oscillating driving signal when the substrate bias voltage is at a second level in a self-refresh mode; an oscillation unit that outputs an oscillating signal according to the oscillating driving signal; and a voltage pumping unit that controls pumping of the substrate bias voltage according to an output signal of the oscillation unit and then outputs the pumping-controlled substrate bias voltage.

According to a third embodiment of the present invention, a substrate bias voltage generator includes: a substrate bias voltage detection unit that compares a level of a substrate bias voltage with a reference voltage in response to an idle signal and a refresh count signal so as to output an oscillating driving signal, enables the oscillating driving signal when the substrate bias voltage is equal to or higher than a first level in a normal mode, and disables the oscillating driving signal when the substrate bias voltage is at a second level in a self-refresh mode; an oscillation unit that outputs an oscillating signal according to the oscillating driving signal; and a voltage pumping unit that controls pumping of the substrate bias voltage according to an output signal of the oscillation unit and then outputs the pumping-controlled substrate bias voltage.

According to a fourth embodiment of the present invention, a method of generating a substrate bias voltage includes: comparing a substrate bias voltage with a reference voltage in response to a self-refresh signal, an idle signal, and a refresh count signal; adjusting a pumping level with respect to the substrate bias voltage on the basis of a result obtained in the comparison; and controlling an output of the substrate bias voltage from a voltage pumping unit such that the substrate bias voltage is at a first level in a normal mode, at a second level when the self-refresh signal is enabled, and at a third level when the self-refresh signal and a substrate bias voltage rising signal are enabled.

According to a fifth embodiment of the present invention, a method of generating a substrate bias voltage includes: comparing a substrate bias voltage with a reference voltage in response to a self-refresh signal; adjusting a pumping level with respect to the substrate bias voltage on the basis of a result obtained in the comparison; and controlling the output of the substrate bias voltage from a voltage pumping unit such that the substrate bias voltage is at a first level in a normal mode and at a second level when the self-refresh signal is enabled.

According to a sixth embodiment of the present invention, a method of generating a substrate bias voltage includes: comparing a substrate bias voltage with a reference voltage in response to an idle signal and a refresh count signal; adjusting a pumping level with respect to the substrate bias voltage on the basis of a result obtained in the comparison; and controlling the output of the substrate bias voltage from a voltage pumping unit such that the substrate bias voltage is at a first level in a normal mode and at a second level when a substrate bias voltage rising signal is enabled in response to the idle signal.

DESCRIPTION OF EXEMPLARY EMBODIMENTS

Hereinafter, preferred embodiments of the present invention are described in detail with reference to the accompanying drawings.

Figure 1:
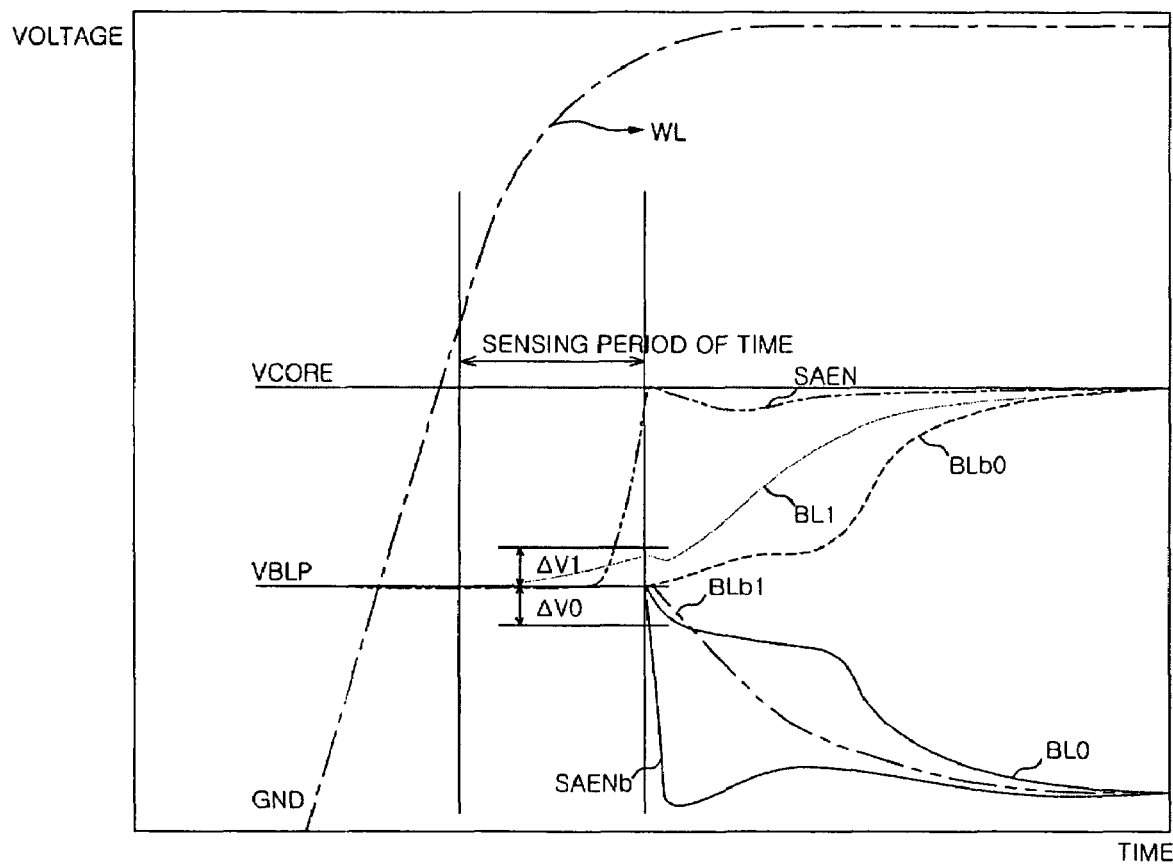
FIG. 1 is a timing diagram illustrating an operation of a sense amplifier in a conventional semiconductor memory apparatus.
Figure 2:
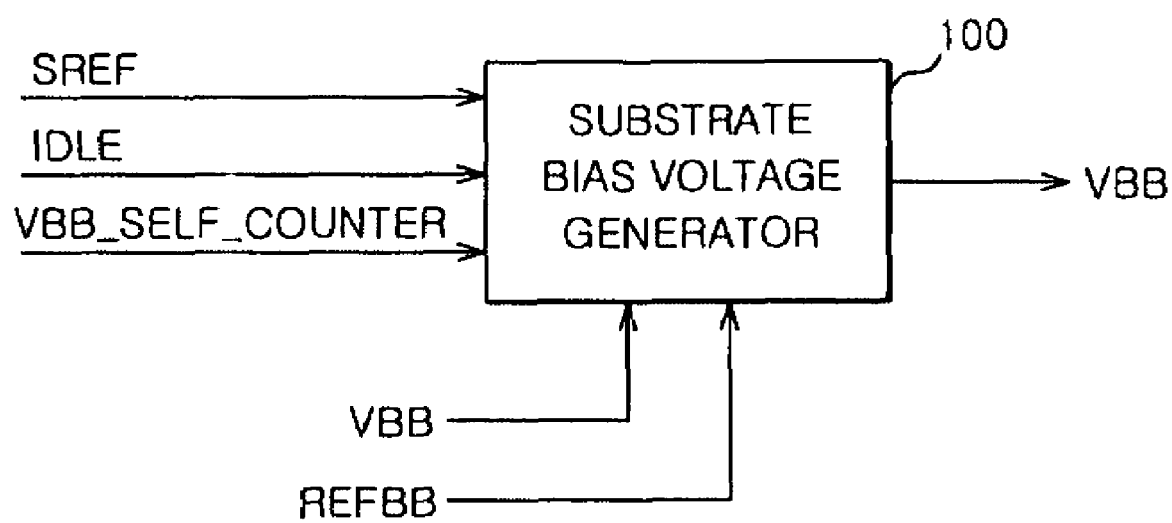
FIG. 2 is a view schematically illustrating a substrate bias voltage generator according to an embodiment of the present invention.

FIG. 2 is a view schematically illustrating a substrate bias voltage generator according to an embodiment of the present invention.

As shown in FIG. 2, a substrate bias voltage generator 100 according to an embodiment of the present invention compares a substrate bias voltage VBB with a reference voltage REFBB in response to a self-refresh signal SREF, an idle signal IDLE, and a refresh count, signal VBB_SELF_COUNTER, adjusts a pumping level with respect to the substrate bias voltage VBB, and then outputs the pumping-adjusted substrate bias voltage VBB.

The pumping level with respect to the substrate bias voltage VBB can be adjusted to be a first level VBB_NOR in a normal mode and to be a second level VBB_ST when the self-refresh signal SREF is enabled. Alternatively, the pumping level with respect to the substrate bias voltage VBB can be adjusted to be the first level VBB_NOR in a normal mode and to be a third level VBB_REF when a substrate bias voltage rising signal VBB_UP_ACT generated by the refresh count signal VBB_SELF_COUNTER is enabled.

Alternatively, the substrate bias voltage VBB can be output after the substrate bias voltage VBB is raised to the first level VBB_NOR in the normal mode, to the second level VBB_ST when the self-refresh signal SREF is enabled, and to the third level VBB_REF when the substrate bias voltage rising signal VBB-UP_ACT, which is generated by the refresh count signal VBB_SELF_COUNTER after the self-refresh signal SREF is enabled, is enabled.

Here, the substrate bias voltage rising signal VBB-UP_ACT holds a disable state when the idle signal IDLE is disabled as a self-refresh active signal SREF_ACT is enabled, and then the substrate bias voltage rising signal VBB-UP_ACT is enabled when the refresh count signal VBB_SELF_COUNTER is enabled. That is, the substrate bias voltage rising signal VBB-UP_ACT is in a disable state during a standby period of time in a self-refresh mode and is in an enable state while the refresh operation is performed by the refresh count signal VBB_SELF_COUNTER.

On the other hand, the idle signal IDLE has a high level in a precharge state and a low level in other states. In addition, the first level VBB_NOR of the substrate bias voltage VBB is lower than the second level VBB_ST thereof, and the second level VBB_ST is lower than the third level VBB_REF.

In other words, the substrate bias voltage generator 100 according to an embodiment of the present invention detects a substrate bias voltage and then performs voltage pumping according to the level of the detected substrate bias voltage so that the substrate bias voltage can have a stable electric potential. In addition, in order to ensure that the substrate bias voltage during the self-refresh operation is higher than the substrate bias voltage during normal operation, the self-refresh operation may be performed by holding the substrate bias voltage at the second level VBB_ST after the self-refresh operation has started, or the self-refresh operation may be performed by holding the substrate bias voltage at the third level VBB_REF when the refresh count signal VBB_SELF_COUNTER for the self-refresh operation is enabled, or the self-refresh operation may be performed by raising the substrate bias voltage to the second level VBB_ST after the self-refresh operation has started and then by raising the substrate bias voltage to the third level VBB_REF whenever the refresh count signal VBB_SELF_COUNTER is enabled. As such, a memory cell can be refreshed with a low gate voltage.

Here, it is possible to reduce the amount of leaking current at a junction before the substrate bias voltage is held at the third level VBB_REF to perform a self-refresh operation in the self-refresh mode, by raising the substrate bias voltage to the second level VBB_ST during the standby period of time while the a refresh operation is not performed. In addition, since the capacitance value at a substrate bias voltage stage is quite large, it is not easy to control the level of the substrate bias voltage within a short time. Accordingly, in the embodiment described above, by sequentially raising the substrate bias voltage from the first level VBB_NOR to the second level VBB_ST and then from the second level VBB_ST to the third level VBB_REF, it is possible to easily control the level of the substrate bias voltage.

Figure 3:
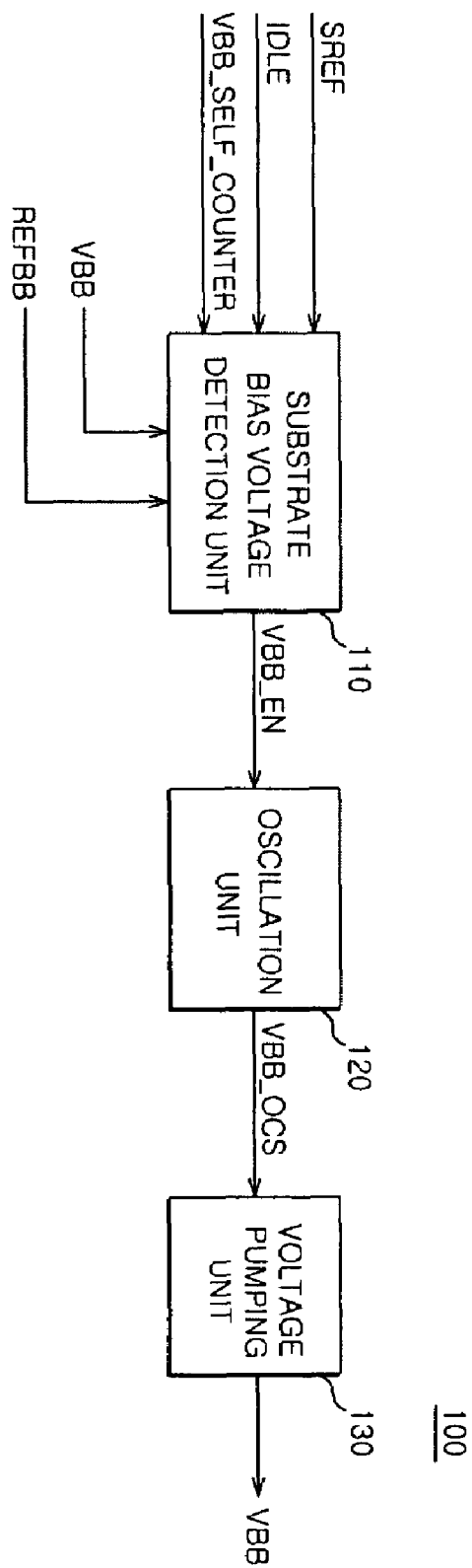
FIG. 3 is a detailed block diagram illustrating the substrate bias voltage generator shown in FIG. 2.

FIG. 3 is a detailed block diagram illustrating the substrate bias voltage generator 100 shown in FIG. 2.

As shown in FIG. 3, the substrate bias voltage generator 100 according to an embodiment of the present invention includes: a substrate bias voltage detection unit 110 that detects the level of the substrate bias voltage VBB by comparing the substrate bias voltage VBB with the reference voltage REFBB in response to the self-refresh signal SREF, the idle signal IDLE, and the refresh count signal VBB_SELF_COUNTER; an oscillation unit 120 that outputs an oscillating signal VBB_OSC according to an oscillating driving signal VBB_EN output from the substrate bias voltage detection unit 110; and a voltage pumping unit 130 that controls pumping of the substrate bias voltage according to the oscillating signal VBB_OSC output from the oscillation unit 120, and then outputs the pumping-controlled substrate bias voltage VBB.

Here, when the oscillating driving signal VBB_EN, which is output from the substrate bias voltage detection unit 110, is at a high level, the oscillation unit 120 enables the oscillating signal VBB_OSC so that the voltage pumping unit 130 drops the substrate bias voltage to a predetermined level.

Then, the substrate bias voltage detection unit 110 compares the level of the substrate bias voltage VBB, which is output from the voltage pumping unit 130, with the level of the reference voltage REFBB in response to the self-refresh signal SREF, the idle signal IDLE, and the refresh count signal VBB_SELF_COUNTER and then outputs the oscillating driving signal VBB_EN. For example, the substrate bias voltage detection unit 110 disables the oscillating driving signal VBB_EN when the substrate bias voltage VBB is sufficiently low and enables the oscillating driving signal VBB_EN when the substrate bias voltage VBB is equal to or higher than the predetermined level.

More specifically, when the substrate bias voltage VBB rises to a level equal to or higher than the first level VBB_NOR in the normal mode, the substrate bias voltage detection unit 110 enables the oscillating driving signal VBB_EN in order to perform the voltage pumping.

On the other hand, when the self-refresh signal SREF is enabled, the substrate bias voltage detection unit 110 makes the oscillating driving signal VBB_EN hold at a disable state until the substrate bias voltage rises to a level equal to or higher than the second level VBB_ST so that the substrate bias voltage 'can be held' at the second level VBB_ST. In addition, when the refresh count signal VBB_SELF_COUNTER is enabled, the substrate bias voltage detection unit 110 makes the oscillating driving signal VBB_EN hold at a disable state until the substrate bias voltage rises to a level equal to or higher than the third level VBB_REF so that the substrate bias voltage can be held at the third level VBB_REF. In addition, when the refresh count signal VBB_SELF_COUNTER is enabled in a state in which the self-refresh signal SREF is enabled to make the substrate bias voltage hold at the second level VBB_ST, the substrate bias voltage detection unit 110 makes the oscillating driving signal VBB_EN hold at a disable state until the substrate bias voltage rises to the level equal to or higher than the third level VBB_REF so that the substrate bias voltage can be held at the second level VBB_ST before the refresh count signal VBB_SELF_COUNTER is enabled and at the third level VBB_REF when the refresh count signal VBB_SELF_COUNTER is enabled.

Figure 4:
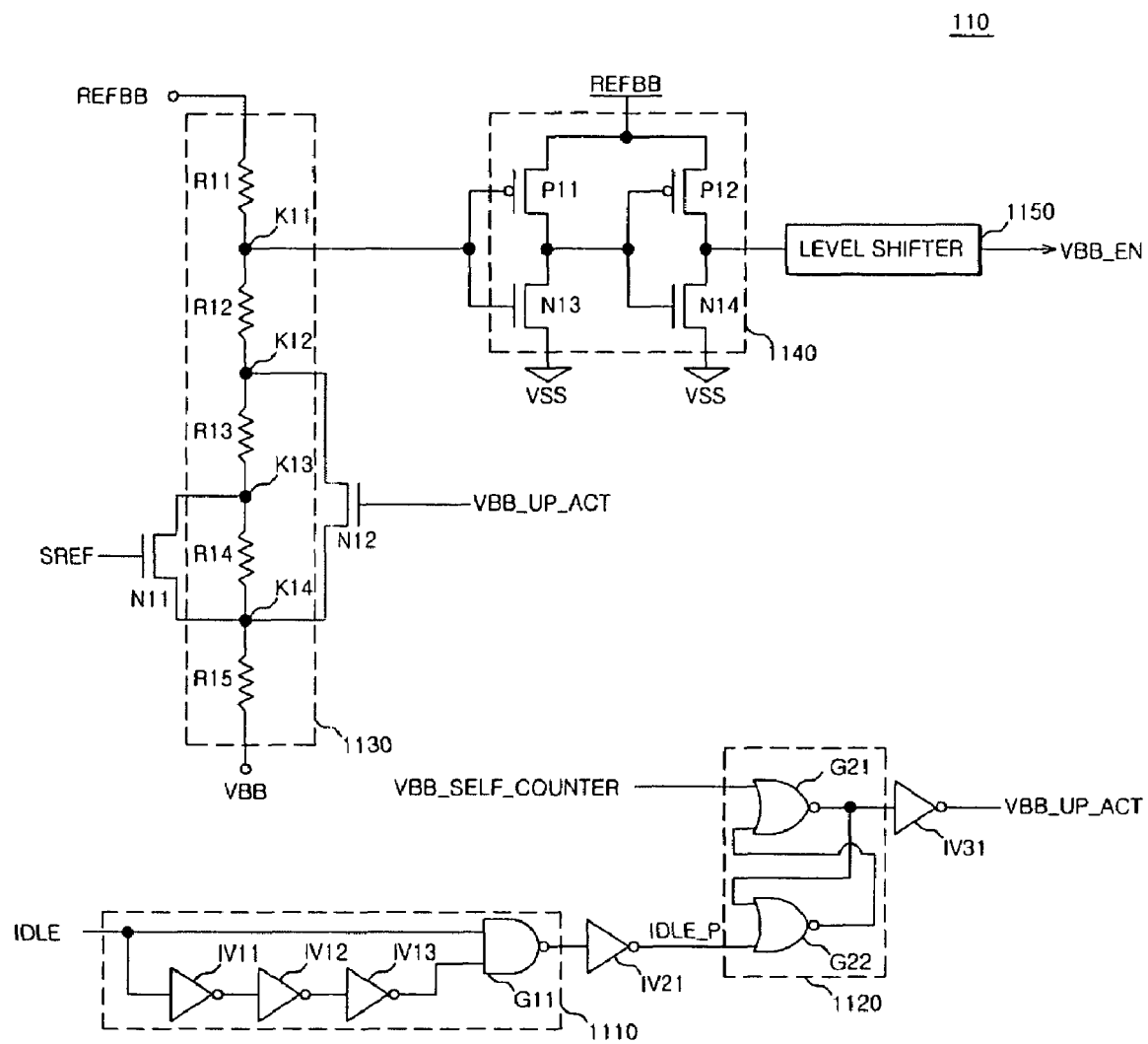
FIG. 4 is a detailed circuit diagram illustrating a substrate bias voltage detection unit shown in FIG. 3.

FIG. 4 is a detailed circuit diagram illustrating the substrate bias voltage detection unit 110 shown in FIG. 3.

As shown in FIG. 4, the substrate bias voltage detection unit 110 includes: a pulse generation unit 1110 that outputs a pulse having a predetermined width in response to an idle signal IDLE having a low level when the self-refresh active signal SREF_ACT is enabled; a latch unit 1120 that outputs the substrate bias voltage rising signal VBB_UP_ACT for adjusting a voltage detection level when the refresh count signal VBB_SELF_COUNTER is enabled in response to an output signal IDLE_P of the pulse generation unit 1110 and the refresh count signal VBB_SELF_COUNTER; a regulator 1130 that is connected between a terminal to which the reference voltage REFBB is input and a terminal to which the substrate bias voltage VBB is input and detects a level of the substrate bias voltage in response to the self-refresh signal SREF or the substrate bias voltage rising signal VBB_UP_ACT or the self-refresh signal SREF and the substrate bias voltage rising signal VBB_UP_ACT; an amplification unit 1140 that is connected to an output terminal K11 of the regulator 1130; and a level shifter 1150 that shifts an output signal of the amplification unit 1140 so as to output the oscillating driving signal VBB_EN.

Here, the pulse generation unit 1110 includes a logic element G11 to which the idle signal IDLE and an inverted and delayed signal of the idle signal IDLE are input. An output signal of the logic element G11 is inverted by an inverter IV21. In addition, the idle signal IDLE input to the logic element G11 is inverted and delayed by an odd number of inverters IV11, IV12, and IV13, and the logic element G11 may be a NAND gate, for example.

The latch unit 1120 includes a first logic element G21 and a second logic element G22. To the first logic element G21, the refresh count signal VBB_SELF_COUNTER is input as a first input signal and an output signal of the second logic element G22 is input as a second input signal, and to the second logic element G22, the output signal IDLE_P of the pulse generation unit 1110 is input as a first input signal and an output signal of the first logic element G21 is input as a second input signal. Each of the first and second logic elements G21 and G22 may be a NOR gate, for example. In addition, an output signal of the latch unit 1120 is inverted by an inverter IV31 to be output as the substrate bias voltage rising signal VBB_UP_ACT. In addition, the latch unit 1120 holds the substrate bias voltage rising signal VBB_UP_ACT in a disable state by means of the output signal of the pulse generation unit 1110 before the refresh, count signal VBB_SELF_COUNTER is enabled, and the latch unit 1120 enables the substrate bias voltage rising signal VBB_UP_ACT when the refresh count signal VBB_SELF_COUNTER is enabled and then supplies the enabled substrate bias voltage rising signal VBB_UP_ACT to the regulator 1130.

On the other hand, the regulator 1130 includes: a plurality of resistors R11, R12, R13, R14, and R15, which are connected in series at nodes K11-K14, respectively, between the terminal to which the reference voltage REFBB is input and the terminal to which the substrate bias voltage VBB is input; a first MOS transistor N11 that is connected across at least one of the plurality of resistors R11, R12, R13, R14, and R15 connected in series and is driven by the self-refresh signal SREF; and a second MOS transistor N12 that is connected across at least two of the plurality of resistors R11, R12, R13, R14, and R15 connected in series and is driven by the substrate bias voltage rising signal VBB_UP_ACT.

Furthermore, the amplification unit 1140 includes a plurality of CMOS inverters that are connected in series between the terminal to which the reference voltage REFBB is input and a ground terminal VSS and are driven by an electric potential applied to the output terminal K11 of the regulator 1130. Each of the CMOS inverters can be implemented by connecting MOS transistors in series, for example transistors P11-N13 and P12-N14.

Hereinafter, it is described how the substrate bias voltage detection unit 110 having the above structure raises the substrate bias voltage in a sequential manner for the self-refresh operation.

In a normal mode, since the self-refresh signal SREF is at a low level and the substrate bias voltage rising signal VBB_UP_ACT output in the self-refresh mode is also at a low level, the first and second MOS transistors N11 and N12 are turned off. Accordingly, when the substrate bias voltage VBB rises to a level equal to or higher than the first level VBB_NOR, a voltage applied to the terminal, to which the reference voltage REFBB is input, is not induced to the terminal to which the substrate bias voltage VBB is input due to the resistors R11, R12, R13, R14, and R15, which raises an electric potential at the output node K11. As a result, the oscillating driving signal VBB_EN is output as a high-level signal.

On the other hand, when the self-refresh signal SREF is enabled, the first MOS transistor N11 is turned on, and thus the effect of the resistor R14 is reduced. Accordingly, even if the substrate bias voltage VBB rises to the level equal to or higher than the first level VBB_NOR, the voltage applied to the terminal, to which the reference voltage REFBB is input, is induced to the terminal to which the substrate bias voltage VBB is input, which lowers the electric potential at the output node K11. As a result, the oscillating driving signal VBB_EN is output as a low-level signal. That is, when the normal mode transitions to the self-refresh mode, the substrate bias voltage VBB rises to the second level VBB_ST.

Furthermore, after the self-refresh signal SREF is enabled, when the self-refresh active signal SREF_ACT is enabled so as to enable the substrate bias voltage rising signal VBB_UP_ACT, both the first and second MOS transistors N11 and N12 are turned on, and thus the effect of the resistors R13 and R14 is reduced. Accordingly, until the substrate bias voltage VBB rises to a level equal to or higher than the second level VBB_ST, that is, to the third level VBB_REF, the voltage applied to the terminal, to which the reference voltage REFBB is input, is induced to the terminal to which the substrate bias voltage VBB is input, which lowers the electric potential at the output node K11. As a result, the oscillating driving signal VBB_EN is output as a low-level signal. That is, when the normal mode transitions to the self-refresh mode, the substrate bias voltage VBB rises to the third level VBB_REF.

Figure 5:
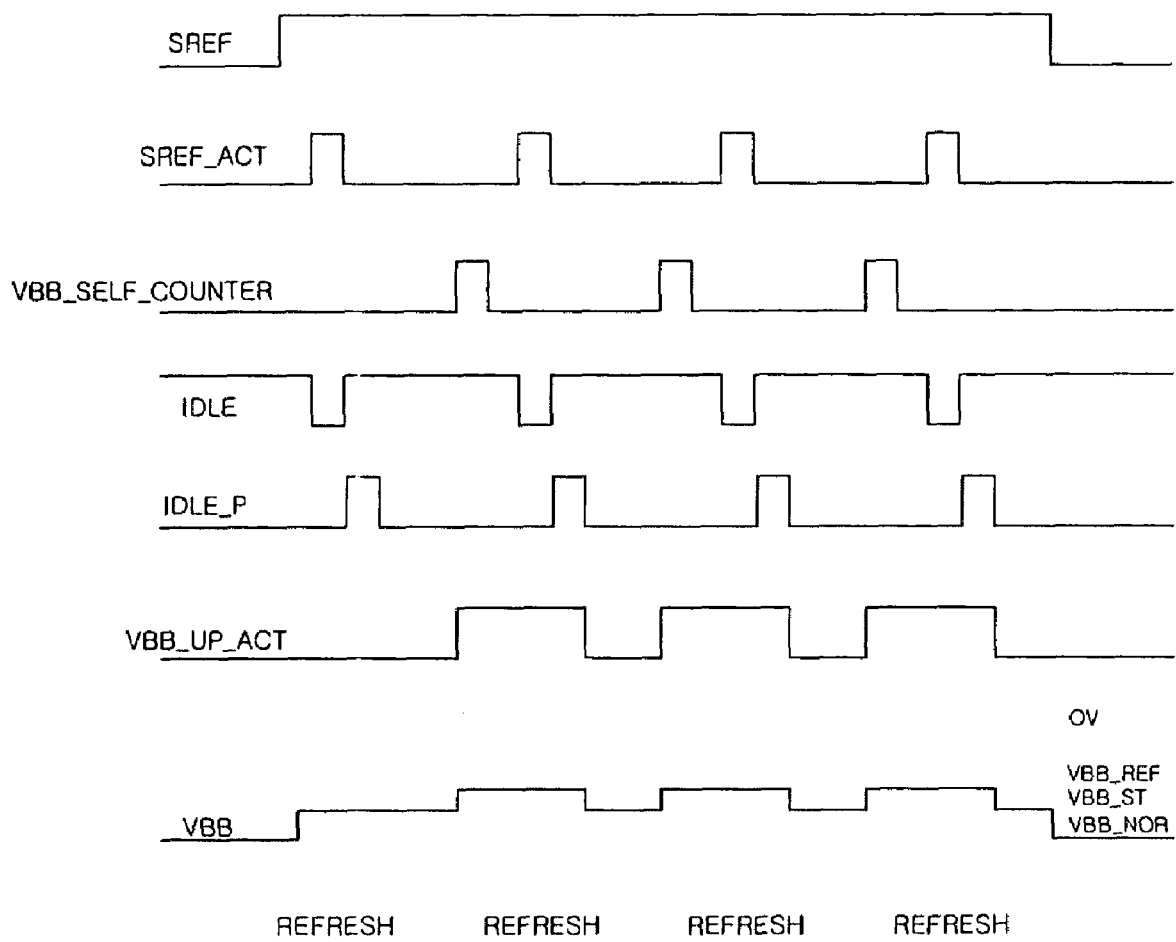
FIG. 5 is a timing diagram illustrating a self-refresh operation when the substrate bias voltage generator according to the embodiment of the present invention is applied.

FIG. 5 is a timing diagram illustrating a self-refresh operation when the substrate bias voltage generator 100 according to an embodiment of the present invention is applied.

Before the self-refresh signal SREF is applied, that is, in the normal mode, the self-refresh signal SREF and the substrate bias voltage rising signal VBB_UP_ACT are at low levels. Accordingly, when the substrate bias voltage rises to the level equal to or higher than the first level VBB_NOR, the regulator 1130 shown in FIG. 4 outputs the oscillating driving signal VBB_EN so as to lower the substrate bias voltage to a stable level.

Thereafter, when the self-refresh signal SREF is enabled, the first MOS transistor N11 of the regulator 1130 is turned on, and thus the effect of the resistor R14 is reduced until the substrate bias voltage rises to the level equal to or higher than the first level VBB_NOR, that is, to the second level VBB_ST. Accordingly, an output signal of the regulator 1130 is output as a low-level signal. As a result, the oscillating driving signal VBB_EN also becomes low level and thus the second level VBB_ST is held without lowering the substrate bias voltage.

Subsequently, when the self-refresh active signal SREF_ACT is enabled while the self-refresh signal SREF is enabled, the idle signal IDLE becomes low level. Accordingly, the output signal IDLE_P of the pulse generation unit 1110 becomes high level, such that the substrate bias voltage rising signal VBB_UP_ACT, which is an output signal of the latch unit 1120, is held in a disable state and the substrate bias voltage VBB is still held at the second level VBB_ST. Then, when the refresh count signal VBB_SELF_COUNTER for the self-refresh operation is enabled, the substrate bias voltage rising signal VBB_UP_ACT, which is the output signal of the latch unit 1120, transitions to an enable state so as to turn on the second MOS transistor N12 of the regulator 1130. Accordingly, since the effect of the resistors R13 and R14 is reduced, the voltage at the output node K11 of the regulator 1130 is at a low level until the level of the substrate bias voltage VBB rises from the second level VBB_ST to the third level VBB_REF. As a result, the oscillating driving signal VBB_EN is output as a low-level signal and thus the substrate bias voltage VBB is held at the third level VBB_REF.

As such, in the normal mode, the substrate bias voltage is held at the first level VBB_NOR, and when the self-refresh operation starts, the substrate bias voltage rises to the second level VBB_ST to perform the self-refresh operation. Then, when the refresh count signal VBB_SELF_COUNTER for the self-refresh operation is enabled, the substrate bias voltage rises to the third level VBB_REF to perform the self-refresh operation. Then, the substrate bias voltage is held at the second level VBB_ST until a next count signal is enabled, and the substrate bias voltage is pumped to the first level VBB_NOR when the self-refresh mode is finished.

At this time, since the refresh count signal VBB_SELF_COUNTER is enabled sufficiently before the self-refresh active signal SREF_ACT is enabled, the required period of time is sufficient to raise the substrate bias voltage to the third level VBB_REF before performing the self-refresh operation.

Next, a case is described in which the substrate bias voltage during the self-refresh operation is held at the second level VBB_ST by using the substrate bias voltage detection unit 110 shown in FIG. 4.

In this case, after the self-refresh signal SREF is enabled, by driving only the first MOS transistor N11 by means of the self-refresh signal SREF without driving the substrate bias voltage rising signal VBB_UP_ACT, the oscillating driving signal VBB_EN is held in a disable state until the substrate bias voltage rises to the level equal to or higher than the first level VBB_NOR, that is, to the second level VBB_ST. Thus, it is possible to perform the self-refresh operation by means of the substrate bias voltage raised to the second level VBB_ST.

At this time, since the substrate bias voltage is controlled by only the self-refresh signal SREF, the pulse generation unit 1110, the latch unit 1120, and the second MOS transistor N12 shown in FIG. 4 are not needed, which is advantageous because the circuit layout can be reduced.

Next, a case is described in which the substrate bias voltage during the self-refresh operation is held at the third level VBB_REF by using the substrate bias voltage detection unit 110 shown in FIG. 4.

In this case, by driving only the second MOS transistor N12 by means of the substrate bias voltage rising signal VBB_UP_ACT that is enabled by the self-refresh active signal SREF_ACT, the oscillating driving signal VBB_EN is held in a disable state until the substrate bias voltage rises to the third level VBB_REF. Thus, it is possible to perform the self-refresh operation by means of the substrate bias voltage raised to the third level VBB_REF.

At this time, since the substrate bias voltage is controlled by only the substrate bias voltage rising signal VBB_UP_ACT, the first MOS transistor N11 shown in FIG. 4 is not needed or is turned off.

According to an embodiment of the present invention, the substrate bias voltage having the first level VBB_NOR in the normal mode rise's to the second level VBB_ST by means of the self-refresh signal SREF and then the substrate bias voltage rises to the third level VBB_REF by means of the substrate bias voltage rising signal VBB_UP_ACT, and thus it is possible to perform the self-refresh operation with a low gate voltage.

Furthermore, according to another embodiment of the present invention, the substrate bias voltage having the first level VBB_NOR in the normal mode rises to the second level VBB_ST by means of the self-refresh signal SREF so that the self-refresh operation can be performed. Alternatively, the substrate bias voltage having the first level VBB_NOR in the normal mode may rise to the third level VBB_REF by means of the substrate bias voltage rising signal VBB_UP_ACT so that the self-refresh operation can be performed.

As described above, in embodiments of the present invention, since different substrate bias voltages are used during the normal operation and the self-refresh operation of the semiconductor memory apparatus, the refresh operation can be reliably performed. In addition, since the substrate bias voltage during the refresh operation has a level higher than that during the normal operation, a leaking current can be reduced.

Furthermore, in embodiments of the present invention, when the normal mode transitions to the refresh mode, the substrate bias voltage rises first and then the substrate bias voltage rises whenever the refresh count signal VBB_SELF_COUNTER is enabled, thereby performing the refresh operation. Accordingly, it is possible to easily control the substrate bias voltage even though the capacitance value at the substrate bias voltage stage is large.

Although the present invention has been described in connection with the exemplary embodiments of the present invention, it will be apparent to those skilled in the art that various modifications and changes may be made thereto without departing from the scope and spirit of the invention. Therefore, it should be understood that the above embodiments are not limiting but illustrative in all aspects. In addition, the scope of the present invention is defined by the appended claims rather than by the above exemplary embodiments, and all changes that fall within metes and bounds of the claims, or equivalents of such metes and bounds are therefore intended to be embraced by the claims.

What is claimed is:

1. A substrate bias voltage generator comprising:
a substrate bias voltage detection unit configured to compare a level of a substrate bias voltage with a reference voltage in response to a self-refresh signal, an idle signal, and a refresh count signal so as to output an oscillating driving signal, to enable the oscillating driving signal when the substrate bias voltage is equal to or higher than a first level in a normal mode, to disable the oscillating driving signal when the substrate bias voltage is at a second level in a self-refresh mode, and to disable the oscillating driving signal when the substrate bias voltage is at a third level in the self-refresh mode;
an oscillation unit having an input to receive the oscillating driving signal and an output to output an oscillating signal according to the oscillating driving signal; and
a voltage pumping unit configured to control pumping of the substrate bias voltage according to the oscillating signal and to output a pumped substrate bias voltage, wherein the pumped substrate bias voltage in the normal and self-refresh modes are different levels and wherein the substrate bias voltage detection unit includes:
a pulse generation unit configured to receive the idle signal and to output a pulse having a predetermined width in response to the idle signal;
a latch unit configured to receive the pulse of the pulse generation unit and the refresh count signal and to output a substrate bias voltage rising signal in response thereto, the substrate bias voltage rising signal being enabled when the refresh count signal is enabled;
a regulator coupled between a reference voltage input terminal and a substrate bias voltage input terminal and configured to detect the level of the substrate bias voltage in response to the self-refresh signal and the substrate bias voltage rising signal and to output an output signal from an output terminal; and
a level shifter configured to received the output signal of the regulator and to output the oscillating driving signal in response thereto.

2. The substrate bias voltage generator of claim 1, wherein the first level of the substrate bias voltage is lower than the second level of the substrate bias voltage, and the second level of the substrate bias voltage is lower than the third level of the substrate bias voltage.

3. The substrate bias voltage generator of claim 1, wherein the regulator includes:
a plurality of resistors coupled in series between the reference voltage input terminal and the substrate bias voltage input terminal;
a first MOS transistor coupled across at least one of the plurality of resistors coupled in series and is driven by the self-refresh signal; and
a second MOS transistor coupled across at least two of the plurality of resistors coupled in series and driven by the substrate bias voltage rising signal.

4. The substrate bias voltage generator of claim 1, wherein the substrate bias voltage rising signal is enabled when the idle signal is disabled by a self-refresh active signal and the refresh count signal is enabled.

5. The substrate bias voltage generator of claim 1,
wherein the pulse generation unit includes:
a logic element having respective inputs to receive the idle signal and an inverted and delayed signal of the idle signal and configured to generate the pulse having the predetermined width as an output signal.

6. The substrate bias voltage generator of claim 5,
wherein the logic element is a NAND gate.

7. The substrate bias voltage generator of claim 1,
wherein the latch unit includes a first logic element and a second logic element having respective output signals,
the first logic element having respective inputs to receive the refresh count signal and the output signal of the second logic element, and
the second logic element having respective inputs to receive the output signal of the pulse generation unit and the output signal of the first logic element.

8. The substrate bias voltage generator of claim 7,
wherein each of the first logic element and the second logic element is a NOR gate.

9. The substrate bias voltage generator of claim 1,
wherein the substrate bias voltage detection unit further includes an amplification unit coupled to the output terminal of the regulator and configured to amplify the output signal of the regulator and to supply it to the level shifter.

10. The substrate bias voltage generator of claim 9,
wherein the amplification unit includes a plurality of CMOS inverters coupled in series between the reference voltage input terminal and a ground terminal and driven by an electric potential applied to the output terminal of the regulator.

11. A substrate bias voltage generator comprising:
a substrate bias voltage detection unit configured to compare a level of a substrate bias voltage with a reference voltage in response to a self-refresh signal so as to output an oscillating driving signal, to enable the oscillating driving signal when the substrate bias voltage is equal to or higher than a first level in a normal mode, and to disable the oscillating driving signal when the substrate bias voltage is at a second level in a self-refresh mode;
an oscillation unit having an input to receive the oscillating driving signal and an output to output an oscillating signal according to the oscillating driving signal; and
a voltage pumping unit configured to control pumping of the substrate bias voltage according to the oscillating signal and to output a pumped substrate bias voltage, wherein the pumped substrate bias voltage in the normal and self-refresh modes are different levels and wherein the substrate bias voltage detection unit includes:
a regulator that coupled between a reference voltage input terminal and a substrate bias voltage input terminal and configured to detect the level of the substrate bias voltage in response to the self-refresh signal and to produce an output signal at an output terminal wherein the regulator includes:
a plurality of resistors coupled in series between the reference voltage input terminal and the substrate bias voltage input terminal;
a MOS transistor coupled across at least one of the plurality of resistors coupled in series and driven by the self-refresh signal; and
a level shifter configured to receive the output signal of the regulator and to output the oscillating driving signal in response thereto.

12. The substrate bias voltage generator of claim 11,
wherein the first level of the substrate bias voltage is lower than the second level of the substrate bias voltage.

13. The substrate bias voltage generator of claim 11,
wherein the substrate bias voltage detection unit further includes an amplification unit coupled to the output terminal of the regulator configured to amplify the output signal of the regulator and to supply it to the level shifter.

14. The substrate bias voltage generator of claim 11,
wherein the amplification unit includes a plurality of CMOS inverters coupled in series between the reference voltage input terminal and a ground terminal and driven by an electric potential applied to the output terminal of the regulator.

15. A substrate bias voltage generator comprising:
a substrate bias voltage detection unit configured to compare a level of a substrate bias voltage with a reference voltage in response to an idle signal and a refresh count signal so as to output an oscillating driving signal, to enable the oscillating driving signal when the substrate bias voltage is equal to or higher than a first level in a normal mode, and to disable the oscillating driving signal when the substrate bias voltage is at a second level in a self-refresh mode;
an oscillation unit having an input to receive the oscillating driving signal and an output to output an oscillating signal according to the oscillating driving signal; and
a voltage pumping unit configured to control pumping of the substrate bias voltage according to the oscillating signal and to output a pumped substrate bias voltage, wherein the pumped substrate bias voltage in the normal and self-refresh modes are different levels and
wherein the substrate bias voltage detection unit includes:
a pulse generation unit configured to receive the idle signal and to output a pulse having a predetermined width in response to the idle signal;
a latch unit configured to receive the pulse of the pulse generation unit and the refresh count signal and to output a substrate bias voltage rising signal in response thereto;
a regulator coupled between a reference voltage input terminal and a substrate bias voltage input terminal and configured to detect the level of the substrate bias voltage in response to the substrate bias voltage rising signal and to output an output signal from an output terminal; and
a level shifter configured to receive the output signal of the regulator and to output the oscillating driving signal in response thereto.

16. The substrate bias voltage generator of claim 15,
wherein the first level of the substrate bias voltage is lower than the second level of the substrate bias voltage.

17. The substrate bias voltage generator of claim 15,
wherein the regulator includes:
a plurality of resistors coupled in series between the reference voltage input terminal and the substrate bias voltage input terminal; and
a MOS transistor coupled across at least two of the plurality of resistors coupled in series and driven by the self-refresh signal.

18. The substrate bias voltage generator of claim 15,
wherein the substrate bias voltage rising signal is enabled when the idle signal is disabled by a self-refresh active signal and the refresh count signal is enabled.

19. The substrate bias voltage generator of claim 15,
wherein the pulse generation unit includes:
a logic element having respective inputs to receive the idle signal and an inverted and delayed signal of the idle signal and configured to generate the pulse having the predetermined width as an output signal.

20. The substrate bias voltage generator of claim 15,
wherein the latch unit includes a first logic element and a second logic element having respective output signals,
the first logic element, having respective inputs to receive the refresh count signal and the output signal of the second logic element and
the second logic element, having respective inputs to receive the output signal of the pulse generation unit and the output signal of the first logic element.

21. The substrate bias voltage generator of claim 15,
wherein the substrate bias voltage detection unit further includes an amplification unit coupled to the output terminal of the regulator and configured to amplify the output signal of the regulator and to supply it to the level shifter.

22. A method of generating a substrate bias voltage, comprising:
comparing a substrate bias voltage with a reference voltage in response to a self-refresh signal, an idle signal, and a refresh count signal;
adjusting a pumping level with respect to the substrate bias voltage on the basis of a result obtained in the comparison; and
controlling an output of the substrate bias voltage from a voltage pumping unit such that the substrate bias voltage is at a first level in a normal mode, at a second level when the self-refresh signal is enabled, and at a third level when the self-refresh signal and a substrate bias voltage rising signal are enabled, wherein the first level, the second level, and the third level are different from each other.

23. The method of generating a substrate bias voltage of claim 22,
wherein the first level of the substrate bias voltage is lower than the second level of the substrate bias voltage, and the second level of the substrate bias voltage is lower than the third level of the substrate bias voltage.

24. The method of generating a substrate bias voltage of claim 22,
wherein the substrate bias voltage rising signal is enabled when the idle signal is disabled by a self-refresh active signal and the refresh count signal is enabled.

25. A substrate bias voltage generator comprising:
a substrate bias voltage detection unit configured to generate different pumping levels with respect to a level of a detected substrate bias voltage and operating modes; and
a pumping block configured to pump the substrate bias voltage according to the pumping levels, to output the substrate bias voltages having the different levels per the operating modes,
wherein the operating modes include a normal mode, a refresh mode and a mode for requesting a risen substrate bias voltage being higher than the substrate bias voltage in the normal mode,
the substrate bias voltage in the normal mode is lower than the substrate bias voltage in the refresh mode, and the substrate bias voltage in the refresh mode is lower than the substrate bias voltage in the mode for requesting the risen substrate bias voltage.

26. The substrate bias voltage generator of claim 25,
wherein the operating modes include a normal mode and a refresh mode, and the substrate bias voltage in the normal mode is lower than the substrate bias voltage in the refresh mode.

27. The substrate bias voltage generator of claim 25,
wherein the operating modes include a normal mode and a mode for requesting a risen substrate bias voltage being higher than the substrate bias voltage in the normal mode, and the substrate bias voltage in the normal mode is lower than the substrate bias voltage in the mode for requesting the risen substrate bias voltage.

\* \* \* \* \*